(12) United States Patent
Yumshtyk et al.

(10) Patent No.: US 6,193,853 B1
(45) Date of Patent: Feb. 27, 2001

(54) MAGNETRON SPUTTERING METHOD AND APPARATUS

(75) Inventors: Gennady Yumshtyk; Michael Ioumchtyk, both of Edmonton (CA)

(73) Assignee: Cametoid Limited, Whitby ( * ) Notice: Subject to any disclaimer, the term of this patent is extended or adjusted under 35 U.S.C. 154(b) by 0 days.

(21) Appl. No.: 09/257,012

(22) Filed: Feb. 25, 1999

(51) Int. Cl.[7] .............................. C23C 14/00; C23C 14/32
(52) U.S. Cl. ............................. 204/192.12; 204/298.21; 204/298.41; 204/298.22; 204/298.23; 204/298.14; 204/192.38; 204/298.15; 204/298.16; 204/298.06; 204/298.09; 204/298.27; 204/298.28; 204/298.29
(58) Field of Search ..................... 204/298.21, 298.41, 204/298.22, 298.23, 192.12, 298.14, 192.38, 298.15, 298.06, 298.09, 298.27, 298.28, 298.29

(56) References Cited

U.S. PATENT DOCUMENTS

| | | | |
|---|---|---|---|
| 3,458,426 | 7/1969 | Rausch et al. | 204/298.06 |
| 3,644,191 | 2/1972 | Katsuo | 204/298.06 |
| 3,852,181 | 12/1974 | Cirkler | 204/298.25 |
| 3,855,110 | 12/1974 | Quinn et al. | 204/298.02 |
| 3,884,793 | 5/1975 | Penfold et al. | 204/298.16 |
| 3,995,187 | 11/1976 | Penfold et al. | 204/192.12 |
| 4,031,424 | 6/1977 | Penfold et al. | 204/192.12 |
| 4,041,353 | 8/1977 | Penfold et al. | 204/192.12 |
| 4,111,782 | 9/1978 | Penfold et al. | 204/298.21 |
| 4,376,025 | 3/1983 | Zega | 204/192.12 |
| 4,478,703 | 10/1984 | Edamura et al. | 204/298.28 |
| 4,536,640 | * 8/1985 | Vukanovic | 204/298.41 |
| 4,842,704 | * 6/1989 | Collins et al. | 204/298.21 |
| 4,885,070 | 12/1989 | Campbell et al. | 204/192.24 |
| 4,933,065 | 6/1990 | Reiner | 204/298.06 |
| 4,960,753 | 10/1990 | Collins et al. | 204/298.06 |
| 5,026,466 | * 6/1991 | Wesemeyer et al. | 204/298.41 |
| 5,070,811 | 12/1991 | Feuterstein et al. | 118/623 |
| 5,228,963 | * 7/1993 | Rose | 204/298.21 |
| 5,298,137 | 3/1994 | Marshall, III | 204/192.12 |
| 5,591,313 | 1/1997 | Barber et al. | 204/192.12 |
| 5,733,418 | 3/1998 | Hershcovitch et al. | 204/192.11 |
| 5,772,772 | 6/1998 | Chi | 118/723 MA |

FOREIGN PATENT DOCUMENTS 63-93857 * 4/1988 (JP) .

OTHER PUBLICATIONS

Patent Abstracts of Japan, vol. 1997, No. 03, Mar. 31, 1997 & JP 08 296038 A (Nissin Electric Co. Ltd), Nov. 12, 1996.
Walker, SJ et al. "Magnetron Sputtering of Solar Coatings Inside Tubes" Journal of Vacuum Science and Technology, Sep.–Oct. 1981, USA, vol. 19, No. 3, pp. 700–703, XP002139700 ISSN: 0022-5355, paragraph '00ll!.
Patent Abstracts of Japan, vol. 012, No. 333 (C–526), Sep. 8, 1988 & JP 63 093857 A (Ishikawajima Harima Heavy Ind Co Ltd), Apr. 25, 1988.

* cited by examiner

Primary Examiner—Nam Nguyen
Assistant Examiner—Daborah Chacko-Davis
(74) Attorney, Agent, or Firm—Lynn C. Schymacher; Hill & Schumacher

(57) ABSTRACT

An elongate emitter is used as a cathode to coat material onto a cylindrical workpiece by magnetron sputterinig. Where the inside surface of the workpiece is coated, the workpiece itself is used as the vacuum sputtering chamber. The overlap between the plasma field and the magnetic field creates a coating zone which is moved along the length of the workpiece to evenly coat the workpicce.

23 Claims, 7 Drawing Sheets

MAGNETRON SPUTTERING METHOD AND APPARATUS

FIELD OF THE INVENTION

The present invention relates to a method and apparatus for applying coatings by magnetron sputtering.

BACKGROUND OF THE INVENTION

Magnetron sputtering is a well known process for applying thin coatings onto objects. Sputtering is implemented by creating an electrical plasma over the surface of an target emitter material in a low-pressure gas atmosphere. Gas ions from the plasma are accelerated by electrical fields to bombard and thereby eject atoms from the surface of the emitter. These atoms travel through the gas environment until they impact the surface of the object to be coated, where they bond to the object, creating the coating layer.

A standard method of improving the efficiency of sputtering has been to use magnetic fields to confine electrons to the glow region in the vicinity of the emitter surface. The addition of such magnetic fields increases the rate of ionization which in turn increases the ion energy and the number of ions in the plasma. The increased ion energy and number of ions increases the overall sputtering rate.

Cylindrical magnetron sputtering devices are known which utilize elongated emitters and solenoid coils which produce flux lines parallel to the axis of the emitter. A significant drawback to such cylindrical sputtering devices is that they suffer from undesirable end effects. In a cylindrical magnetron, the direction of the electron drift velocity vector causes the electrons to orbit around the longitudinal axis of the emitter. However, the electrons tend to leak out or escape their orbits near each end of the emitter, resulting in lower ionization intensities and therefore lower sputtering rates at each end of the emitter. As a result, the portions of the object to be coated in the vicinity of the ends of the emitter may receive little or no coating.

Another drawback to cylindrical magnetrons is that in order to uniformly coat long objects such as pipes, a corresponding long vacuum chamber, emitter and solenoid coil must be provided, adding to the complexity and expense of the apparatus.

Therefore, there is a need in the art for apparatuses and methods suitable for uniformly coating long cylindrical objects such as pipes and the like.

SUMMARY OF THE INVENTION

In general terms, the invention comprises magnetron sputtering methods and apparatuses which may uniformly coat either the interior or exterior of elongated cylindrical workpieces. The invention includes configurations where the workpiece is oriented vertically or horizontally. In a preferred embodiment, means to heat the workpiece in the area being sputtered are provided as well as means for tensioning the workpiece to prevent warping as a result of the heat.

In one aspect of the invention, the invention comprises a sputtering process for applying a coating onto an elongate, hollow cylindrical workpiece having an internal surface and an external surface, said process comprising the steps of:

a) providing a vacuum chamber and introducing a sputtering gas into a low pressure environment in the vacuum chamber;

b) providing an elongate emitter and positioning the emitter substantially parallel to the surface of the workpiece to be coated, positioning the workpiece so the surface of the workpiece to be coated is in the low pressure environment;

c) creating a plasma field between the emitter and the workpiece by providing a power supply connected to the emitter and the workpiece; and d) creating a magnetic field around the emitter having flux lines substantially and uniformly parallel along a length of the emitter by providing a solenoid coil in a configuration of a coiled tubular conductor connected to a high current/low voltage power supply, wherein an area of overlap between the magnetic field and the plasma field defines a coating zone.

In an embodiment of the invention, the method is applicable to coating the internal surface of the workpiece, where the workpiece itself is used as the vacuum chamber, the emitter is coaxial with the workpiece and has a length less than the workpiece and the coating zone is moved by moving the emitter along the centroidal axis of the workpiece. Preferably, the solenoid has a coiled length approximately equal to the length of the emitter and the coating zone is moved by moving both the solenoid and the emitter along the length of the workpiece in a synchronized fashion.

Alternatively, the solenoid has a coiled length approximately equal to the length of the workpiece and remains stationary while the emitter moves. In another alternative embodiment, the emitter has a length approximately equal to the length of the workpiece and the coating zone is moved by moving the solenoid along the length of the workpiece.

In another embodiment, the method is applicable to coating the external surface of the workpiece, wherein the solenoid coil surrounds the vacuum chamber, the emitter is adjacent and parallel to the workpiece within the vacuum chamber and has a length less than the workpiece and the coating zone is moved by moving the emitter along an axis parallel to the workpiece while the workpiece is rotated along its centroidal axis.

Preferably, the solenoid may have a coiled length approximately equal to the length of the emitter and the coating zone is moved by moving both the solenoid and the emitter along the length of the workpiece in a synchronized fashion. Alternatively, the solenoid may have a coiled length approximately equal to the length of the workpiece and remains stationary while the emitter moves. In another alternative embodiment wherein the external surface of the workpiece is coated, the emitter is adjacent and parallel to the workpiece and has a length approximately equal to the length of the workpiece, the coating zone is moved by moving the solenoid along the length of the workpiece.

With any of these alternative embodiments, the method preferably includes a step wherein the solenoid heats the workpicce in the vicinity of the coating zone and the workpiece is subjected to a tensioning force.

In another aspect of the invention, the invention comprises an apparatus for sputter deposition of a coating onto an internal surface of an elongate, hollow cylindrical workpiece, said workpiece defining an internal chamber, said apparatus comprising:

a) an elongate emitter coaxial to the workpiece to be coated;

b) end plates for sealing the open ends of the workpiece including means to evacuate the chamber and means for introducing a sputtering gas into the chamber;

c) a power supply connected to the emitter and the workpiece for creating a plasma field between the emitter and the workpiece;

d) a solenoid coil in a configuration of a coiled tubular conductor surrounding the workpiece and a high current/low voltage power supply connected to the coiled tubular conductor for creating a magnetic field within the chamber having flux lines substantially and uniformly parallel to the longitudinal axis of the emitter; and e) wherein an area of overlap between the magnetic field and the plasma field defines a coating zone.

Preferably, the emitter has a length less than the length of the workpiece and the means for moving the coating zone comprises means for moving the emitter along the centroidal axis of the workpiece. More preferably, the coiled length of the solenoid is approximately equal to the length of the emitter and the means for moving the coating zone further comprises means for moving the solenoid together with the emitter in a synchronized manner.

Alternatively, the coiled length of the solenoid is approximately equal to the length of the workpiece and no means for moving the solenoid coil relative to the workpiece are provided. In another alternative embodiment, the length of the emitter is approximately the same as the workpiece and the means for moving the coating zone comprises means for moving the solenoid coil along the length of the workpiece.

Preferably, the apparatus is configured such that the solenoid heats the workpiece and further comprises means for tensioning the workpiece longitudinally.

In another aspect of the invention, the invention comprises an apparatus for sputter deposition of a coating onto an external surface of an elongate, cylindrical workpiece, said apparatus comprising:

(a) a cylindrical vacuum chamber having a vacuum pump outlet and a sputtering gas inlet;

(b) a solenoid coil in a configuration of a coiled tubular conductor surrounding the vacuum chamber and a high current/low voltage power supply connected to the coiled tubular conductor for creating a magnetic field substantially parallel to the longitudinal axis of the chamber;

(c) an elongate emitter centrally located within the chamber;

(d) means for positioning the workpiece within the chamber, parallel to the longitudinal axis of the chamber and the emitter;

(e) means for rotating the workpiece along its longitudinal axis; and (f) a power supply connected to the emitter and the workpiece for creating a plasma field between the emitter and the workpiece wherein an area of overlap between the magnetic field and the plasma field defines a coating zone.

Preferably, the emitter has a length less than the length of the workpiece and the means for moving the coating zone comprises means for moving the emitter along the centroidal axis of the workpiece. More preferably, the coiled length of the solenoid is approximately equal to the length of the emitter and the means for moving the coating zone further comprises means for moving the solenoid together with the emitter in a synchronized mariner.

Alternatively, the coiled length of the solenoid is approximately equal to the length of the workpiece and no means for moving the solenoid relative to the workpiece are provided. In the further alternative, the length of the emitter is approximately the same as the workpiece and the means for moving the coating zone comprises means for moving the solenoid along the length of the workpiece.

Preferably, the apparatus is configured such that solenoid heats the workpiece in the vicinity of the coating zone and further comprises means for tensioning the workpiece longitudinally.

BRIEF DESCRIPTION OF THE DRAWINGS

The invention will now be described by way of exemplary embodiments with reference to the accompanying simplified, diagrammatic, not-to-scale drawings. In the drawings.

DETAILED DESCRIPTION OF THE INVENTION

Figure 1:
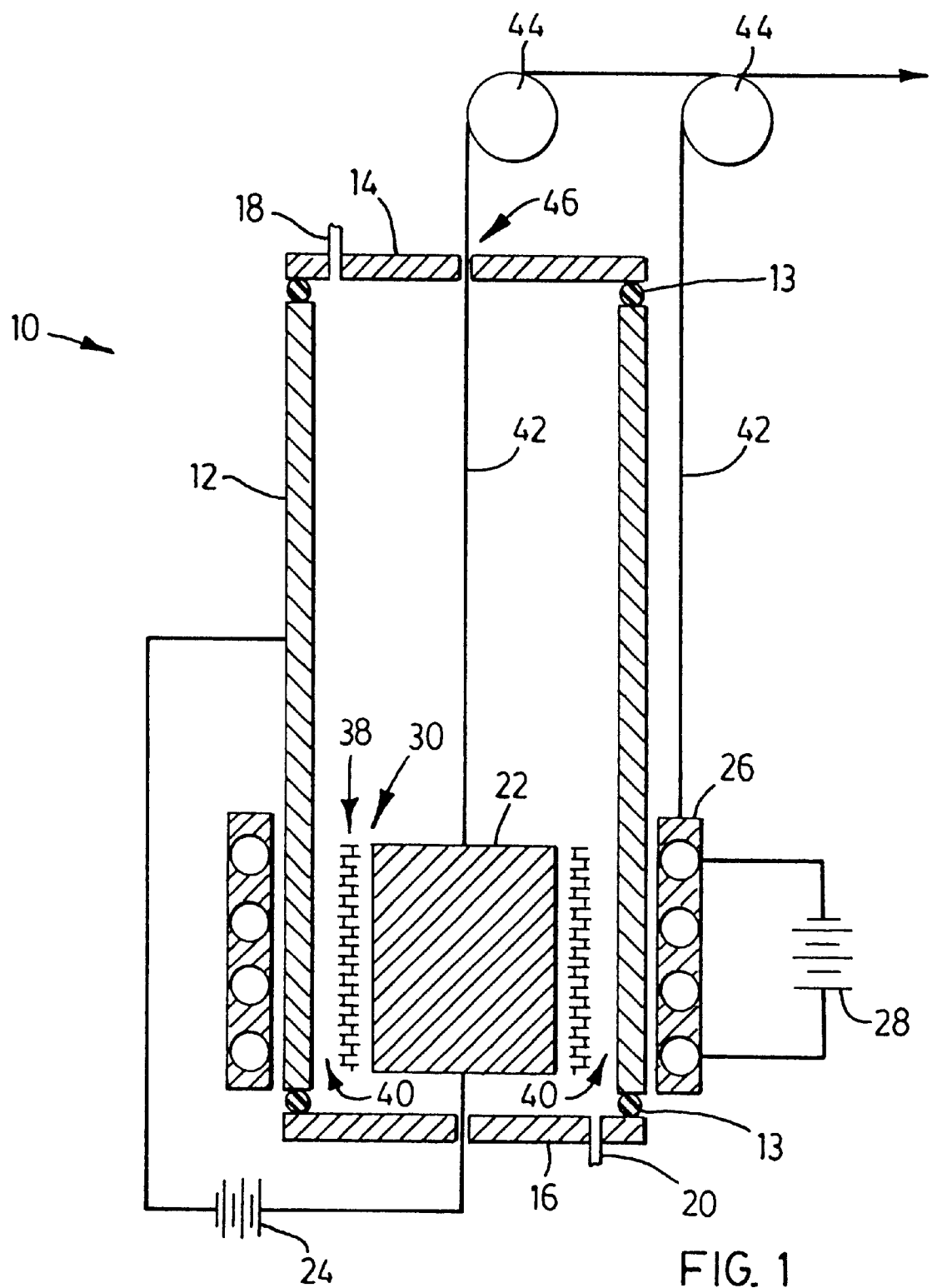
FIG. 1 is a cross-sectional depiction of a preferred embodiment of the invention wherein the inside surface of a workpiece is coated.

The invention according to the FIG. 1 comprises a sputtering apparatus (10) for coating the internal surface of an elongated cylindrical workpiece (12) such as a pipe wherein the workpiece (12) itself serves as the vacuum sputtering chamber.

End plates (14, 16) are fitted to the open ends of the workpiece (12) with O-ring gaskets (13) as is well-known in the art. The top end plate (14) includes an inert gas inlet (18) while the bottom end plate (16) includes a discharge (20) which leads to a vacuum pump (not shown).

In the present invention, the workpiece (12) acts as an anode while a cathode, referred to herein as the emitter (22), comprises the material desired to be coated on the workpicce (12). The emitter (22) may be a commodity grade tube or solid cylinder of the coating material. Suitable coating materials are well known for many different applications such as corrosion protection or erosion or physical wear protection. Titanium, stainless steel or aluminum may be utilized as the coating material along with other conducting or semi-conducting materials. The emitter (22) may comprise a core which is itself coated with a deposit of the coating material by thermal spraying or electroplating.

A high voltage power source (24) is placed between the emitter (22) and the workpiece (12) as is shown in FIG. 1. When switched on, the power source creates a high potential difference between the workpiece (12) and the emitter (22) which enables the creation of a plasma field (38) around the emitter. The emitter (22) should be water-cooled as is well known in the art.

Figure 3:
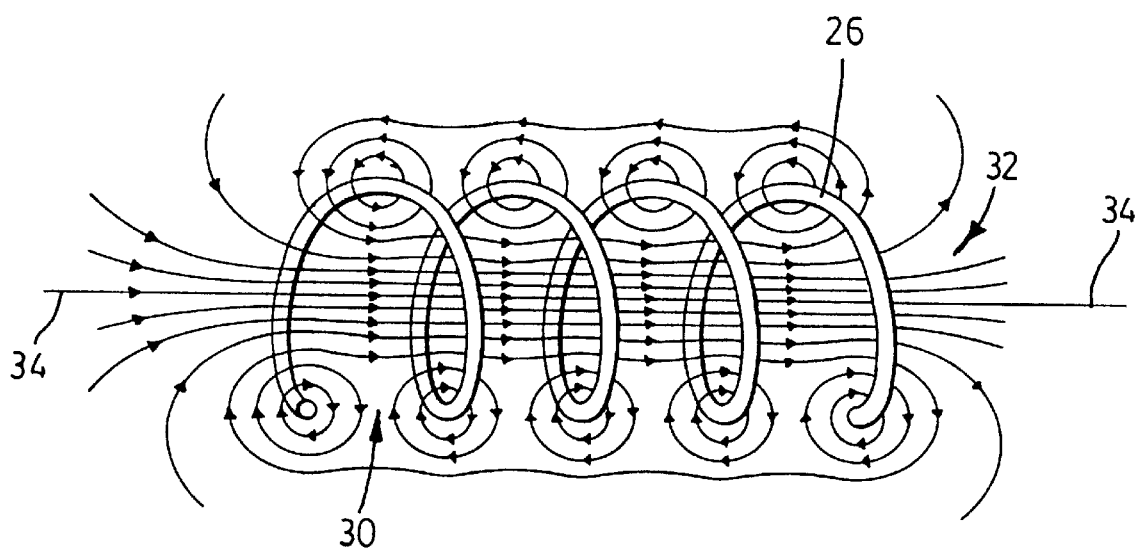
FIG. 3 is a schematic depiction of the field lines generated by the solenoid coil of the present invention.

The solenoid coil (26) is wound around the workpiece (12) and comprises copper tubing in the preferred embodiment. Other highly conductive, heat resistant materials may be used in the place of copper tubing. The solenoid (26) is connected to a high current, low voltage power supply (28) which may be an inductive or an RF power source, which are well-known in the art. As a result, the solenoid (26) creates a magnetic field (30) with magnetic field lines (32) parallel to the centroidal axis (34) of the solenoid as is schematically depicted in FIG. 3.

In operation, the sputtering chamber (12, 50) is evacuated and an inert gas, preferably argon, is fed through the inlet pipe (18) into the sputtering chamber (36). The high voltage power supply (24) is connected to the cathode emitter (22) and to the anode workpiece (12). The high voltage creates a glow discharge and plasma in the argon gas in the vicinity of the emitter (22) surface, forming a plasma sheath (38) around the emitter. Essentially, electrons are discharged at high energies from the cathode emitter (22) into the argon gas to create the plasma in which the argon atoms are stripped of electrons and ionized. These highly excited ionized argon atoms from the plasma accelerate towards the emitter (22) and bombard the emitter (22) to sputter or erode atoms from the emitter surface. The sputtered atoms are also quite highly excited, migrate to the surface of the workpiece (12), where they embed and plate themselves onto the surface.

A magnetic field (30) is induced within the sputtering chamber (12, 50) by means of the high current, low voltage solenoid (26) which is coiled around the workpiece (12) as shown in the Figures. The magnetic field lines (32) are substantially axial and parallel to the cylindrical emitter (22) as is schematically depicted in FIG. 3. The highest concentration of magnetic field lines is in the centre of the solenoid (26) and magnetic field strength is constant over the longitudinal cross-section of the solenoid (26).

In the preferred embodiment the solenoid coil (26) is fashioned from a material of high conductivity such as copper tubing. The magnetic field strength is given by the following expression which is derived from Ampere's law:

$$\beta = \mu_o I n$$

where $\beta$=field strength in Gauss $\mu_o$=permeability constant

I=current n=number of turns per unit length

As is obvious, higher currents will result in higher magnetic field strengths which will result in higher efficient sputtering. As well, the more tightly packed the coil (high number of turns per unit length), the higher the field strength. A minimum field strength of about 300 Gauss is generally required for magnetron sputtering. In the preferred embodiment, a field strength of about 700 Gauss is preferred.

The magnetic field (30) generated by the solenoid (26) of the present invention causes electrons to orbit around the emitter (22), along the longitudinal axis of the emitter, parallel to the magnetic field lines (32) shown in FIG. 3. Such electrons tend to leak out or escape their orbits near each end of the emitter (22), resulting in lower sputtering rates at each end of the emitter (22), if the emitter is approximately the same length as the solenoid, or longer than the solenoid. This disadvantage is overcome in the preferred embodiment by moving the emitter (22) and solenoid coil (26) relative to the workpiece (12) to provide a more even coating distribution along the length of the workpiece (12).

In one embodiment of the invention, synchronized movement of the emitter (22) and the solenoid (26) is accomplished by means of a cable and electric motor configuration. As is illustrated in FIG. 1. the emitter (22) and solenoid (26) are each attached by means of a cable (42) and sheaves (44) to an electric drive (not shown) such that they are moved in unison. The first cable (42) passes through the top end plate (14), using conventional sealed fittings (46), and attaches to the emitter (22). The second cable (42) attaches to the solenoid (26). The cables (42) are made from or coated with non-conductive materials such as well-known polymers or ceramics.

Figure 2:
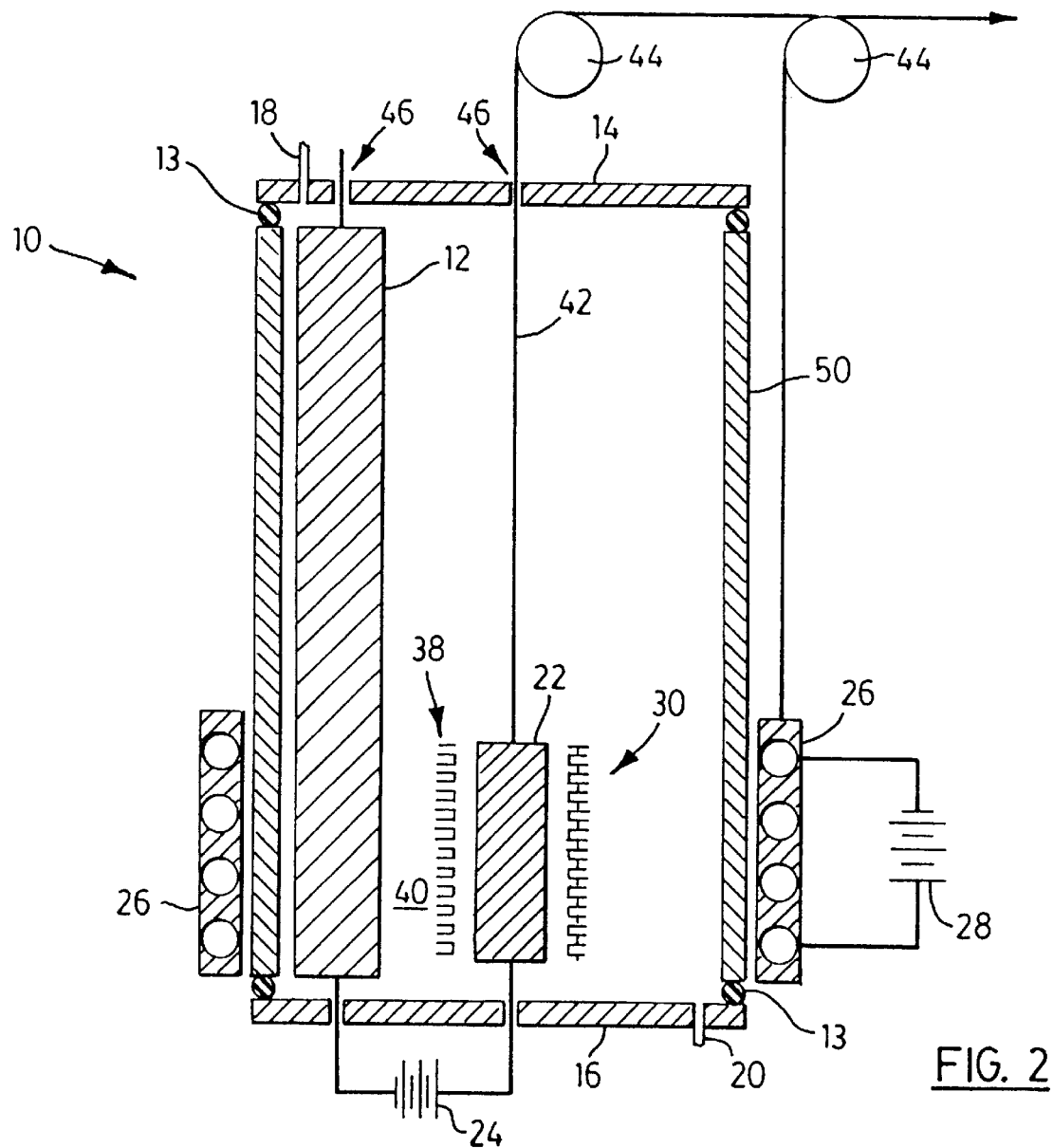
FIG. 2 is a cross-sectional depiction of a preferred embodiment of the invention wherein the outside surface of a workpiece is coated.

The present invention may readily be adapted to provide an apparatus and method which coats the exterior surface of an elongated cylindrical workpiece (12) as is shown in FIG. 2. In this embodiment, a separate vacuum chamber (50) with top and bottom end plates (14, 16) are provided to house the workpiece (12) and the emitter (22). A solenoid coil (26) is disposed outside the vacuum chamber (50). The workpiece (12) must be rotated around its centroidal axis to ensure even deposition of the coating material as the emitter (22) and solenoid (26) are moved longitudinally relative to the workpiece (12) by means of the cables (42), sheaves (44) and electric motor which are oriented similarly to the embodiment illustrated in FIG. 1.

The magnetic field (30) greatly enhances the sputtering efficiency of the present invention. Although sputtering will take place along the entire length of the emitter (22) where a gas plasma field (38) has been created, if a magnetic field (30) of sufficient strength is present, sputtering efficiency increases 100-fold or more. As a result, the area of overlap between the magnetic field (30) and the plasma field (38) is referred to herein as the "coating zone" (40). This zone is where sputtering occurs at a rate sufficient to create a coating of significant thickness. In the preferred embodiment shown in FIGS. 1 and 2, the plasma field (38) and the magnetic field (30) closely overlap because the solenoid (26) and the emitter (22) are approximately equal in length and are positioned opposite each other. The coating zone (40) is moved along the length of the workpiece (12) by moving both the solenoid and the emitter at the same time.

Figure 4:
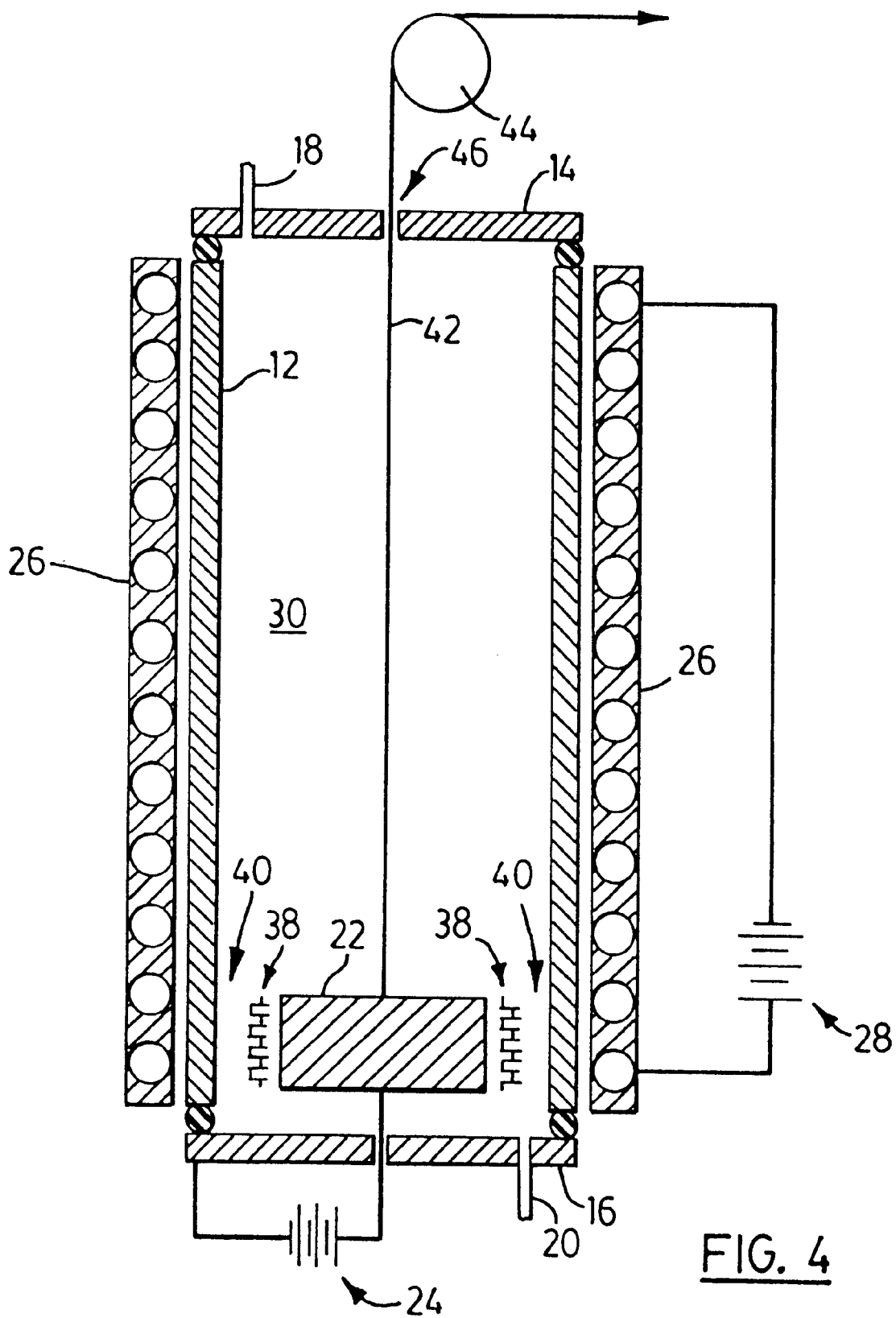
FIG. 4 is a depiction of an alternative embodiment wherein the emitter is moved relative to the workpiece and the solenoid.
Figure 5:
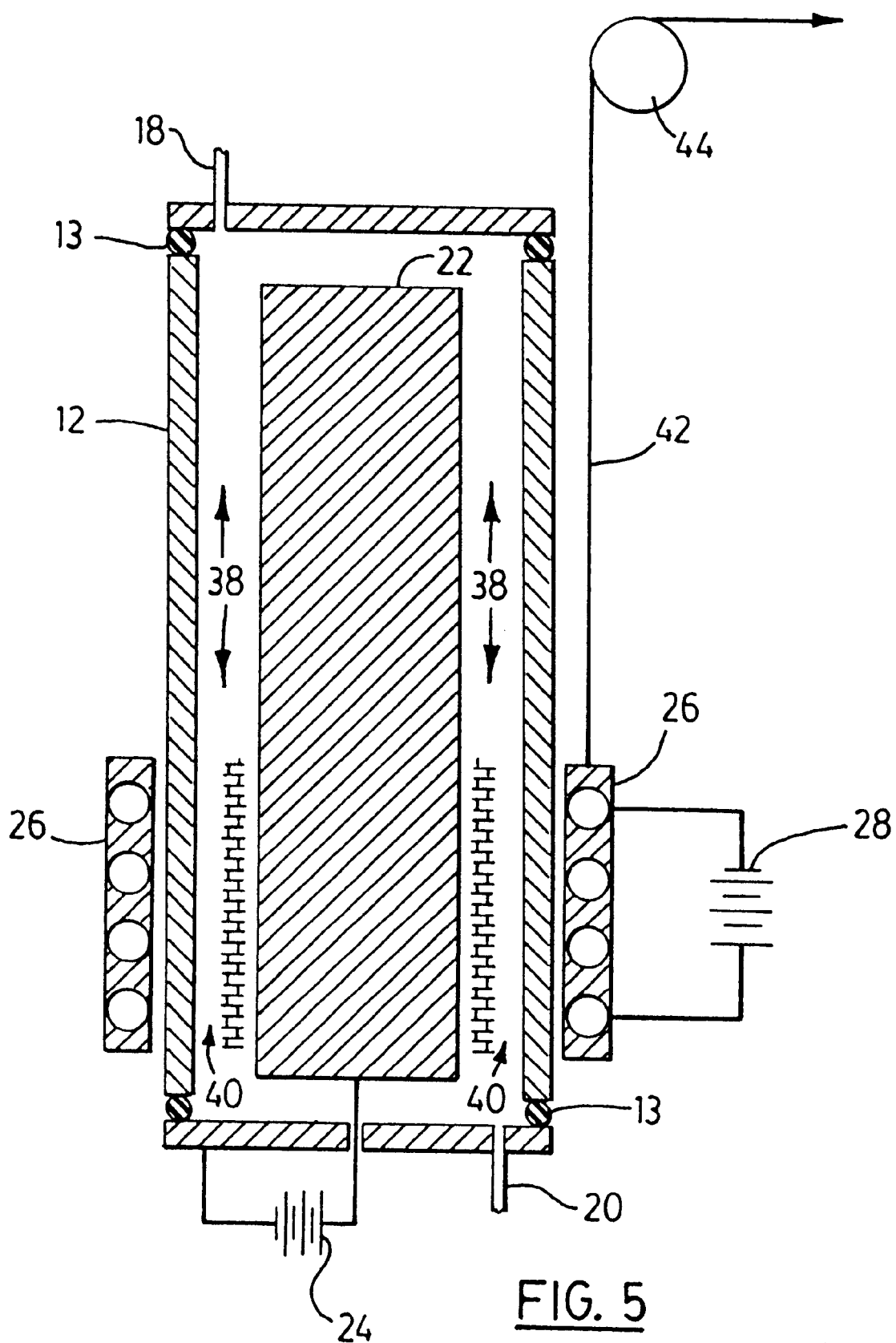
FIG. 5 is a depiction of an alternative embodiment wherein the emitter remains stationary and the solenoid is moved relative to the workpiece and the emitter.

In alternative embodiments, with both the internal and external coating apparatuses, the solenoid (26) can be made long enough to create a magnetic field (30) which envelops the entire workpiece (12) and fixed into place surrounding the workpiece (12). In that case, as shown in FIG. 4, the emitter (22) may be significantly smaller in length and be moved back and forth along the length of the workpiece (12). In that case, the coating zone (40) is confined to the area of the plasma field. Alternatively, the emitter (22) may be made in a length approximately equal to the length of the workpiece (12) and the solenoid (26) moved relative to the workpiece and the emitter, as is shown in FIG. 5. In this latter case, the coating zone is confined to the area of the magnetic field.

It is known that the sputtered atoms emitted by the emitter (22) arrive at the workpiece (12) surface with sufficient energy that surface impurities may be driven off and the sputtered atom may penetrate into the lattice of workpiece substrate to generate a diffusion-type coating. If the workpiece (12) is at an elevated temperature, the sputtered molecules may be more efficient in penetrating the lattice, thereby creating a better bond between the workpiece and the coating layer. Therefore, it is preferable to heat the workpiece in the vicinity of the coating zone (40). In the preferred embodiment, the solenoid (26) is used to generate heat as a result of the high current flowing through it and is associated with the workpiece so as to heat the portions of the workpiece (12) within the coating zone. The solenoid heats the workpiece by induction heat transfer, therefore, it is unnecessary to have any physical means to conduct the heat to the workpiece (12).

Figure 6:
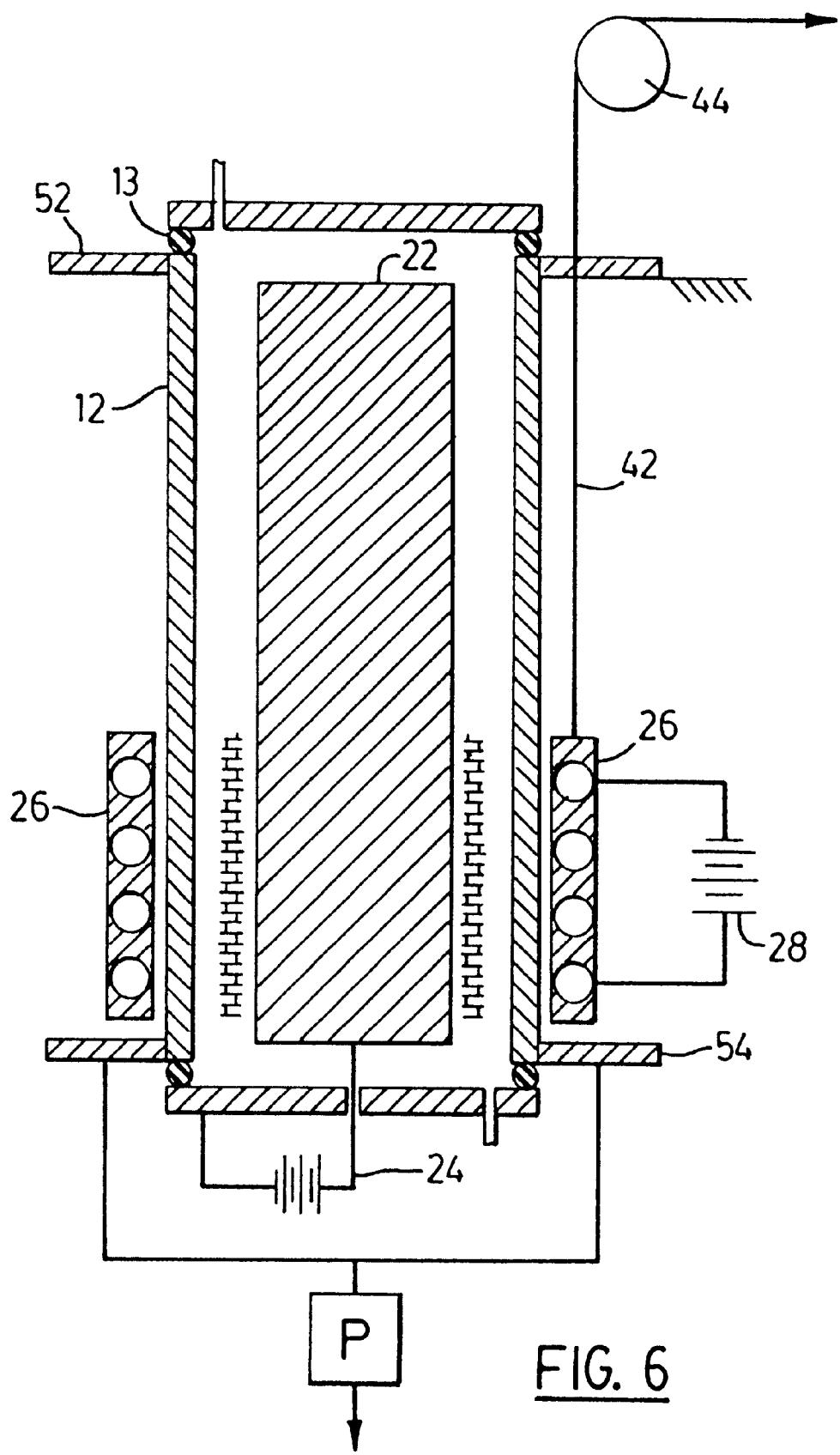
FIG. 6 is a depiction of the embodiment of FIG. 5 with the addition of tensioning means.

One problem that may occur when heating portions of an elongated cylindrical workpiece (12) is that the workpiece may warp as a result of uneven thermal expansion. The potential problem is alleviated in a preferred embodiment of the present invention by orienting the workpiece vertically and further alleviated by tensioning the workpicce by fixing the top end plate (14) and applying a tensioning force to the workpiece (12) or the bottom end plate (16) as is shown in FIG. 6. The tensioning force counteracts any tendency for the workpicce to warp and may be applied, for example, by providing a support flange (52) at one end of the workpiece and another flange (54) at the end, to which a tensioning force (52) is applied. The force may be applied as simply as attaching a weight (not shown) to the flange (54).

The amount of tension applied to the workpiece (12) may be determined by the size of the workpiece (wall thickness, inside and outside diameters), its material composition and the temperature being applied. The amount of tension may be varied by a simple tensioning mechanism by increasing or decreasing the weight which is applied to the workpiece. Alternatively, a hydraulic tensioning system may be adapted to provide the necessary force using a hydraulic cylinder and ram (not shown). In either instance, the tensioning load applied may be precisely controlled so that the workpiece can freely expand and contract, returning to its original shape and length at the end of the coating process.

Figure 7:
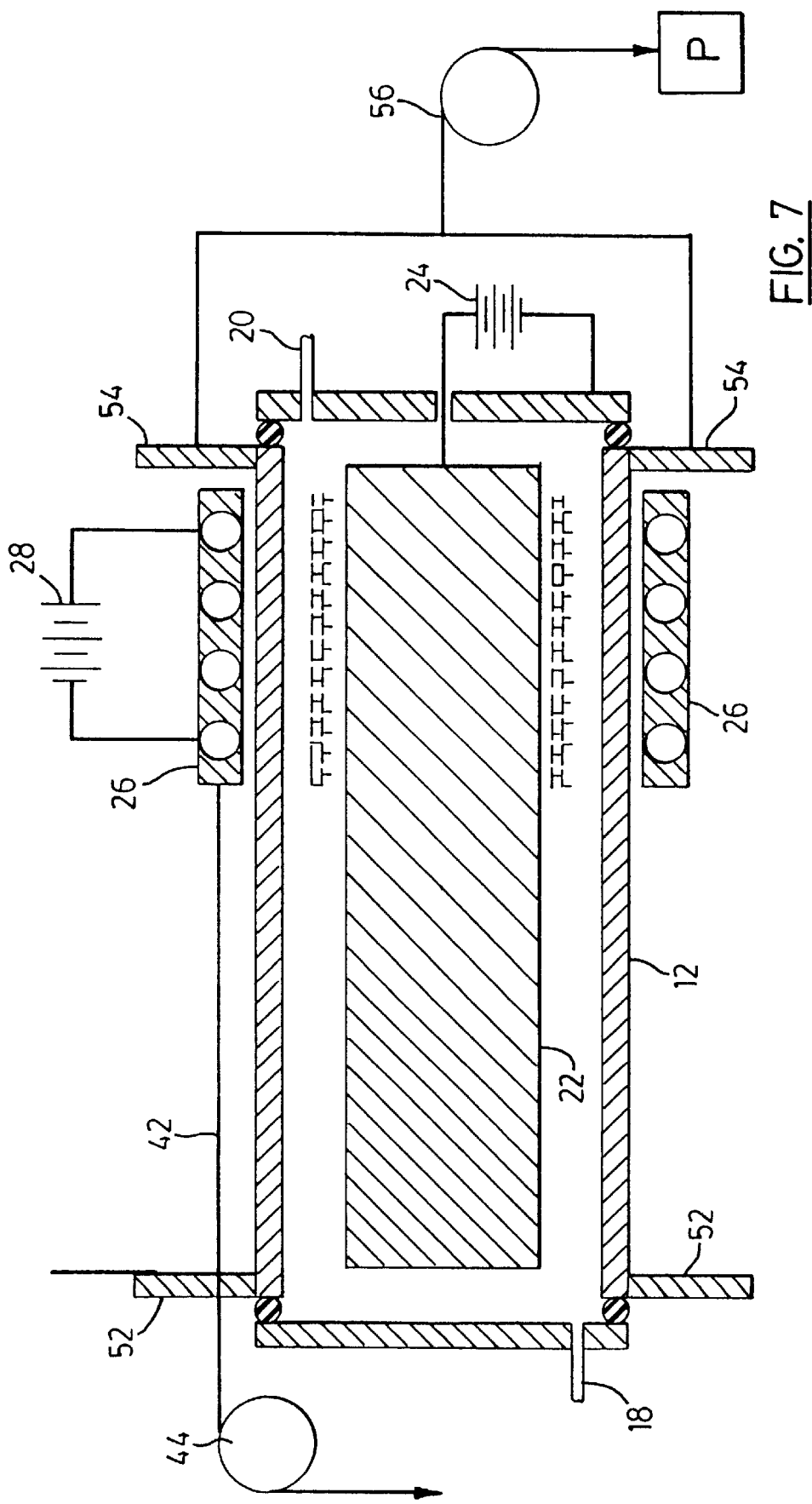
FIG. 7 is a depiction of the embodiment of FIG. 5 wherein the workpiece is oriented horizontally and is tensioned longitudinally.

In another alternative embodiment, shown in FIG. 7, the workpiece (12) may be oriented horizontally, supported at both ends and attached to a cable and pulley tensioning means (56).

As will be apparent to those skilled in the art, various modifications, adaptations and variations of the foregoing specific disclosure can be made without departing from the teachings of the present invention.

The embodiments of the invention in which an exclusive property or privilege is claimed are defined as follows:

1. A sputtering process for applying a coating onto an elongate, hollow cylindrical workpiece having an internal surface and an external surface, said process comprising the steps of:
   a) providing a vacuum chamber and introducing a sputtering gas into a low pressure environment in the vacuum chamber;
   b) providing an elongate emitter and positioning the emitter substantially parallel to the surface of the workpiece to be coated, positioning the workpiece so the surface of the workpiece to be coated is in the low pressure environment;
   c) creating a plasma field between the emitter and the workpiece by providing a power supply connected to the emitter and the workpiece; and
   d) creating a magnetic field around the emitter having flux lines substantially and uniformly parallel along a length of the emitter by providing a solenoid coil in a configuration of a coiled tubular conductor connected to a high current/low voltage power supply, wherein an area of overlap between the magnetic field and the plasma field defines a coating zone.

2. The method of claim 1 wherein the internal surface of the workpiece is coated, the workpiece itself is used as the vacuum chamber, the emitter is coaxial with the workpiece and has a length less than the workpiece, and including moving the coating zone by moving the emitter along a centroidal axis of the workpiece.

3. The method of claim 2 wherein the coiled tubular conductor has a length approximately equal to the length of the emitter and the coating zone is moved by moving both the solenoid and the emitter along the length of the workpiece in a synchronized fashion.

4. The method of claim 2 wherein the coiled tubular conductor has a length approximately equal to the length of the workpiece and remains stationary while the emitter moves.

5. The method of claim 1 wherein the internal surface of the workpiece is coated and the workpiece itself is used as the vacuum chamber, the emitter is coaxial with the workpiece and has a length approximately equal to the length of the workpiece, and including moving the coating zone by moving the coiled tubular conductor along the length of the workpiece.

6. The method of claim 1 wherein the coiled tubular conductor inductively heats the workpiece in the vicinity of the coating zone and the workpiece is subjected to a tensioning force.

7. The method of claim 6 wherein the workpiece is oriented vertically.

8. The method of claim 1 wherein the external surface of the workpiece is coated, the coiled tubular conductor surrounds the vacuum chamber, the emitter is adjacent and parallel to the workpiece within the vacuum chamber and has a length less than the workpiece, and including moving the coating zone by moving the emitter along an axis parallel to the workpiece while the workpiece is rotated along its centroidal axis.

9. The method of claim 8 wherein the coiled tubular conductor has a length approximately equal to the length of the emitter, and including moving the coating zone by moving both the solenoid and the emitter along the length of the workpiece in a synchronized fashion.

10. The method of claim 8 wherein the coiled tubular conductor has a length approximately equal to the length of the workpiece.

11. The method of claim 1 wherein the external surface of the workpiece is coated, the emitter is adjacent and parallel to the workpiece and has a length approximately equal to the length of the workpiece, and including moving the coating zone by moving the coiled tubular conductor along the length of the workpiece.

12. An apparatus for sputter deposition of a coating onto an internal surface of an elongate, hollow cylindrical workpiece, said workpiece defining an internal chamber, said apparatus comprising:
   a) an elongate emitter coaxial to the workpiece to be coated;
   b) end plates for sealing the open ends of the workpiece including means to evacuate the chamber and means for introducing a sputtering gas into the chamber;
   c) a power supply connected to the emitter and the workpiece for creating a plasma field between the emitter and the workpiece;
   d) a solenoid coil in a configuration of a coiled tubular conductor surrounding the workpiece and a high current/low voltage power supply connected to the coiled tubular conductor for creating a magnetic field within the chamber having flux lines substantially and uniformly parallel to the longitudinal axis of the emitter; and
   e) wherein an area of overlap between the magnetic field and the plasma field defines a coating zone.

13. The apparatus of claim 12 wherein the emitter has a length less than the length of the workpiece and including means for moving the coating zone including means for moving the emitter along a centroidal axis of the workpiece.

14. The apparatus of claim 13 wherein the coiled tubular conductor has a length approximately equal to the length of the emitter and the means for moving the coating zone further comprises means for moving the coiled tubular conductor together with the emitter in a synchronized manner.

15. The apparatus of claim 12 wherein the coiled tubular conductor has a length approximately equal to the length of the workpiece.

16. The apparatus of claim 12 wherein the length of the emitter is approximately the same as the workpiece, and means for moving the coating zone includes means for moving the coiled tubular conductor along the length of the workpiece.

17. The apparatus of claim 12 wherein the coiled tubular conductor inductively heats the workpiece and further comprising means for tensioning the workpiece longitudinally.

18. An apparatus for sputter deposition of a coating onto an external surface of an elongate, cylindrical workpiece, said apparatus comprising:
   (a) a cylindrical vacuum chamber having a vacuum pump outlet and a sputtering gas inlet;
   (b) a solenoid coil in a configuration of a coiled tubular conductor surrounding the vacuum chamber and a high current/low voltage power supply connected to the coiled tubular conductor for creating a magnetic field substantially parallel to the longitudinal axis of the chamber;
   (c) an elongate emitter centrally located within the chamber;
   (d) means for positioning the workpiece within the chamber, parallel to the longitudinal axis of the chamber and the emitter;
   (e) means for rotating the workpiece along its longitudinal axis; and
   (f) a power supply connected to the emitter and the workpiece for creating a plasma field between the emitter and the workpiece wherein an area of overlap between the magnetic field and the plasma field defines a coating zone.

19. The apparatus of claim 18 wherein the emitter has a length less than the length of the workpiece, and means for moving the coating zone including means for moving the emitter along a centroidal axis of the workpiece.

20. The apparatus of claim 19 wherein the coiled tubular conductor has a length approximately equal to the length of the emitter and the means for moving the coating zone further comprises means for moving the coiled tubular conductor together with the emitter in a synchronized manner.

21. The apparatus of claim 19 wherein the coiled tubular conductor has a length approximately equal to the length of the workpiece.

22. The apparatus of claim 18 wherein the length of the emitter is approximately the same as the workpiece and means for moving the coating zone including means for moving the coiled tubular conductor along the length of the workpiece.

23. The apparatus of claim 18 wherein the coiled tubular conductor inductively heats the workpiece in the vicinity of the coating zone and further comprising means for tensioning the workpiece longitudinally.

* * * * *